US008274797B2

(12) United States Patent
Ono et al.

(10) Patent No.: US 8,274,797 B2
(45) Date of Patent: Sep. 25, 2012

(54) ELECTRONIC COMPONENT

(75) Inventors: Kazuyuki Ono, Anjo (JP); Yoshio Tanaka, Koka (JP); Kiyoshi Nakajima, Higashiomi (JP); Naoto Kuratani, Kameoka (JP); Tomofumi Maekawa, Osaka (JP)

(73) Assignee: OMRON Corporation, Kyoto (JP)

( * ) Notice: Subject to any disclaimer, the term of this patent is extended or adjusted under 35 U.S.C. 154(b) by 171 days.

(21) Appl. No.: 12/674,694

(22) PCT Filed: Feb. 18, 2009

(86) PCT No.: PCT/JP2009/000670
§ 371 (c)(1),
(2), (4) Date: May 5, 2010

(87) PCT Pub. No.: WO2010/001505
PCT Pub. Date: Jan. 7, 2010

(65) Prior Publication Data
US 2011/0044017 A1 Feb. 24, 2011

(30) Foreign Application Priority Data
Jul. 2, 2008 (JP) ................................. 2008-173383

(51) Int. Cl.
*H05K 7/00* (2006.01)
(52) U.S. Cl. .......................... 361/767; 361/760; 174/262
(58) Field of Classification Search .......... 174/261–266; 361/760, 767, 768
See application file for complete search history.

(56) References Cited

U.S. PATENT DOCUMENTS

| 5,508,556 | A | * | 4/1996 | Lin | 257/691 |
|---|---|---|---|---|---|
| 6,034,427 | A | * | 3/2000 | Lan et al. | 257/698 |
| 6,426,565 | B1 | * | 7/2002 | Bhatt et al. | 257/783 |
| 6,853,089 | B2 | | 2/2005 | Ujiie et al. | |
| 7,214,326 | B1 | * | 5/2007 | Yang et al. | 216/13 |
| 2002/0084518 | A1 | * | 7/2002 | Hasebe et al. | 257/676 |
| 2002/0149102 | A1 | * | 10/2002 | Hashemi et al. | 257/706 |
| 2004/0155332 | A1 | | 8/2004 | Petty-Weeks et al. | |
| 2007/0242440 | A1 | * | 10/2007 | Sugaya et al. | 361/762 |

FOREIGN PATENT DOCUMENTS

| JP | 08-181166 A | 7/1996 |
|---|---|---|
| JP | 2001-267452 A | 9/2001 |
| JP | 2006-098323 A | 4/2006 |
| JP | 2006-524904 A | 11/2006 |
| TW | 569404 B | 1/2004 |

OTHER PUBLICATIONS

Chinese Office Action issued in Chinese Application No. 200980100230.2 dated Mar. 22, 2011 and English translation thereof, 8 pages.
International Search Report w/translation from PCT/JP2009/000670 dated Mar. 24, 2009 (2 pages).

* cited by examiner

*Primary Examiner* — Hoa C Nguyen
(74) *Attorney, Agent, or Firm* — Osha Liang LLP

(57) ABSTRACT

An electronic component has a printed substrate having a die bonding portion, a semiconductor element rigidly bonded to the die bonding portion of the printed substrate by a die bonding resin, and a wire bonding terminal formed by a conductor pattern on the printed substrate that is connected to the semiconductor element by a bonding wire. A groove portion located at a level lower than the conductor pattern of the printed substrate is formed in a region located on at least a die bonding portion side in a region surrounding the wire bonding terminal.

5 Claims, 7 Drawing Sheets

(Prior Art)

ELECTRONIC COMPONENT

TECHNICAL FIELD

The present invention relates to an electronic component, specifically to an electronic component in which a semiconductor element such as a sensor chip and an electronic circuit is mounted on a substrate.

BACKGROUND ART

For example, Patent Document 1 discloses an electronic component (triaxial acceleration sensor) as an electronic component in which a semiconductor element is covered with a cap while mounted on a package. In an electronic component 11 disclosed in Patent Document 1, as illustrated in FIG. 1, a package 12 includes a cavity substrate in which a recess 13 is formed in a central portion of an upper surface, and a semiconductor element 14 is fixed to a bottom surface in the recess 13 by a die bonding resin. In the package 12, a wire bonding terminal pattern 15 is provided in a position higher than a surface to which the semiconductor element 14 is bonded, that is, in a surrounding area of the recess 13. A terminal of the semiconductor element 14 and the terminal pattern 15 of the package 12 is connected by a bonding wire 16. After the semiconductor element 14 is mounted in the package 12, a cap 17 is bonded to the package 12, and the semiconductor element 14 is confined in a space between the package 12 and the cap 17.

In the electronic component 11 having the above-described structure, the die bonding resin by which the semiconductor element 14 is bonded to the bottom surface of the recess 13 does not flow onto the terminal pattern 15 during the die bonding of the semiconductor element 14. Therefore, the flowing-out die bonding resin can prevent generation of a coating film in the terminal pattern 15, and a coating film of the die bonding resin can prevent generation of a wire bonding defect when the bonding wire 16 is bonded to the terminal pattern 15.

However, disadvantageously cost of the electronic component 11 increases because of expensive cavity substrate in which the recess 13 is formed.

When not the cavity substrate, but a flat printed substrate is used for the purpose of cost reduction, because a surface to which the die bonding resin is applied becomes flush with a wire bonding terminal surface, the die bonding resin flows to the wire bonding terminal surface to soil the terminal surface, which possibly causes the wire bonding defect. That is, even if the die bonding resin application amount is correctly managed, or even if a pressing force of the semiconductor element 14 is managed so as to be kept constant, the amount of die bonding resin flowing out from the lower surface of the semiconductor element 14 varies depending on the time the die bonding resin is cured or a temperature of an external environment. Additionally, flexible resin such as silicone is frequently used as the die bonding resin in order to relax a characteristic variation factor such as vibration from the outside of the semiconductor element, and the fluidity is further increased when the flexible resin is used. As a result, the flowing-out die bonding resin adheres to the wire bonding terminal surface to form a coating in the terminal surface, and occasionally the coating film prevents the bonding wire from being joined to the terminal surface.

If an inexpensive printed substrate is employed, it is necessary to sufficiently increase a distance between the wire bonding terminal surface and the resin to which the die bonding of the semiconductor element is performed. However, when the distance is increased, a size of the electronic component 11 is enlarged to prevent miniaturization, and the bonding wire (Au wire) is lengthened to lead to the cost increase.

Patent Document 1: Japanese Unexamined Patent Publication No. 2006-98323

SUMMARY OF INVENTION

One or more embodiments of the present invention provides an electronic component in which the bonding wire connection defect is hardly generated even if the inexpensive printed substrate is used.

In accordance with one aspect of the present invention, there is provided an electronic component, in which a semiconductor element is rigidly bonded to a die bonding portion of a printed substrate using a die bonding resin, and the semiconductor element and a wire bonding terminal formed by a conductor pattern of the printed substrate are connected by a bonding wire, wherein a groove portion located at a level lower than the conductor pattern of the printed substrate is formed in a region located on at least the die bonding portion side in a region surrounding the wire bonding terminal.

In the electronic component of one aspect of the invention, the groove portion located at a level lower than the conductor pattern of the printed substrate is formed in the region located on at least the die bonding portion side in the region surrounding the wire bonding terminal. Therefore, in mounting the semiconductor element on the die bonding portion, even if the die bonding resin flows out from the die bonding portion, the die bonding resin flowing onto the wire bonding terminal side can be trapped by the groove portion to prevent the die bonding resin from adhering to the surface of the wire bonding terminal. Therefore, the risk that the coating film is generated in the surface of the wire bonding terminal by the die bonding resin is eliminated, and the wire bonding can securely be performed to the wire bonding terminal to reduce the wire bonding defect.

In the electronic component according to one aspect of the present invention, the groove portion is formed over a whole periphery of the region surrounding the wire bonding terminal. Accordingly, the groove portion is formed so as to surround the wire bonding terminal, so that the die bonding resin that reaches the wire bonding terminal so as to run around from the die bonding portion can also be trapped by the groove portion.

In the electronic component according to another aspect of the present invention, the groove portion is formed by removing the conductor pattern of the printed substrate. Accordingly, the groove portion is formed by the portion in which the conductor pattern is removed, so that the groove portion can easily be formed at low cost.

In the electronic component according to another aspect of the present invention, the groove portion is formed by further removing a substrate core material of the printed substrate. Accordingly, the groove portion is formed by removing the conductor pattern and the substrate core material, so that the groove portion can be deepened. Even if a large amount of die bonding resin flows out from the die bonding portion, the die bonding resin can be prevented from adhering onto the wire bonding terminal.

the electronic component according to another aspect of the present invention, a surface of the wire bonding terminal is subjected to Au plating. Because the die bonding resin has poor wettability to the Au plating, the Au plating repels the die bonding resin flowing in the groove portion, whereby the die bonding resin hardly adheres onto the wire bonding terminal.

Figure 1:
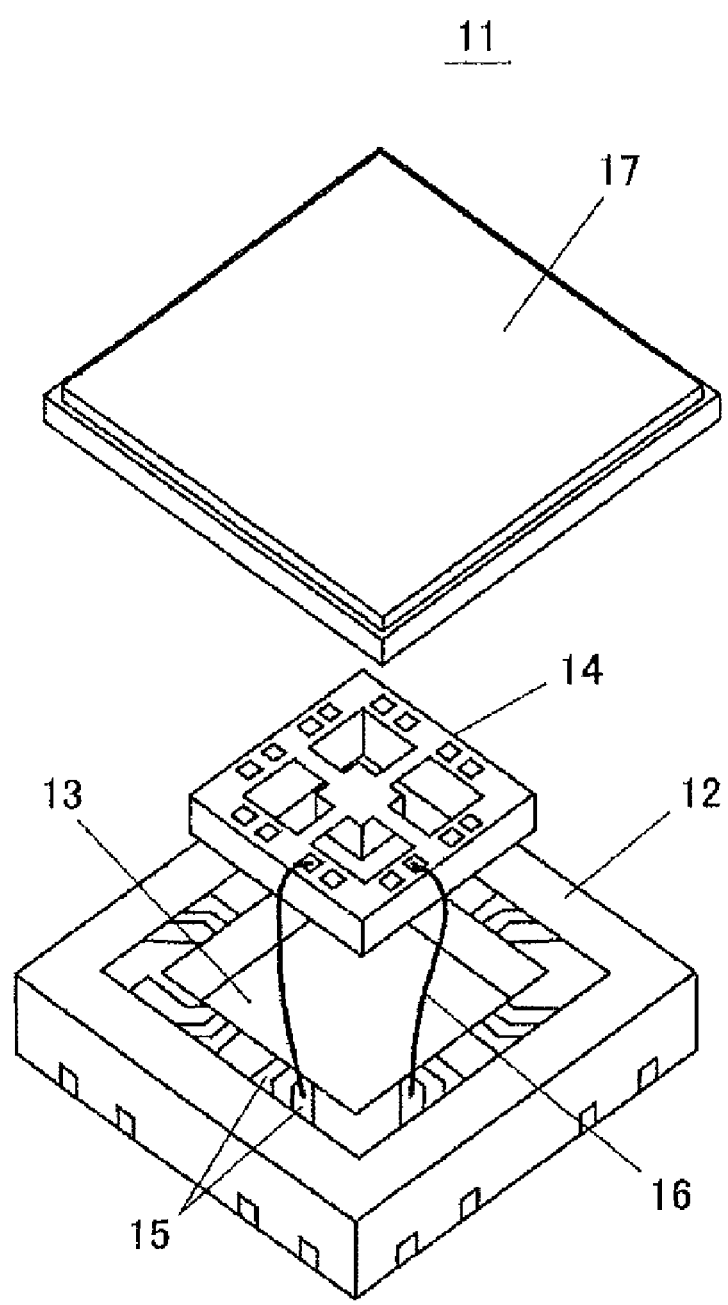
FIG. 1 is a sectional view illustrating of a mode of an electronic component disclosed in Patent Document 1.

DESCRIPTION OF SYMBOLS 51 electronic component
52 substrate
52a substrate core material
53 semiconductor element
55 die bonding portion
56 wire bonding terminal
58 surface-side ground pattern
60 groove portion
61 Au plating
62 lead electrode
63 rear-surface-side ground pattern
64 groove portion
65 and 66 through-hole
67 solder resist
68 die bonding resin
69 bonding wire
70 flange
71 conductive joining member
76 wire bonding terminal

DETAILED DESCRIPTION

Preferred embodiments of the invention will be described with reference to the accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 2:
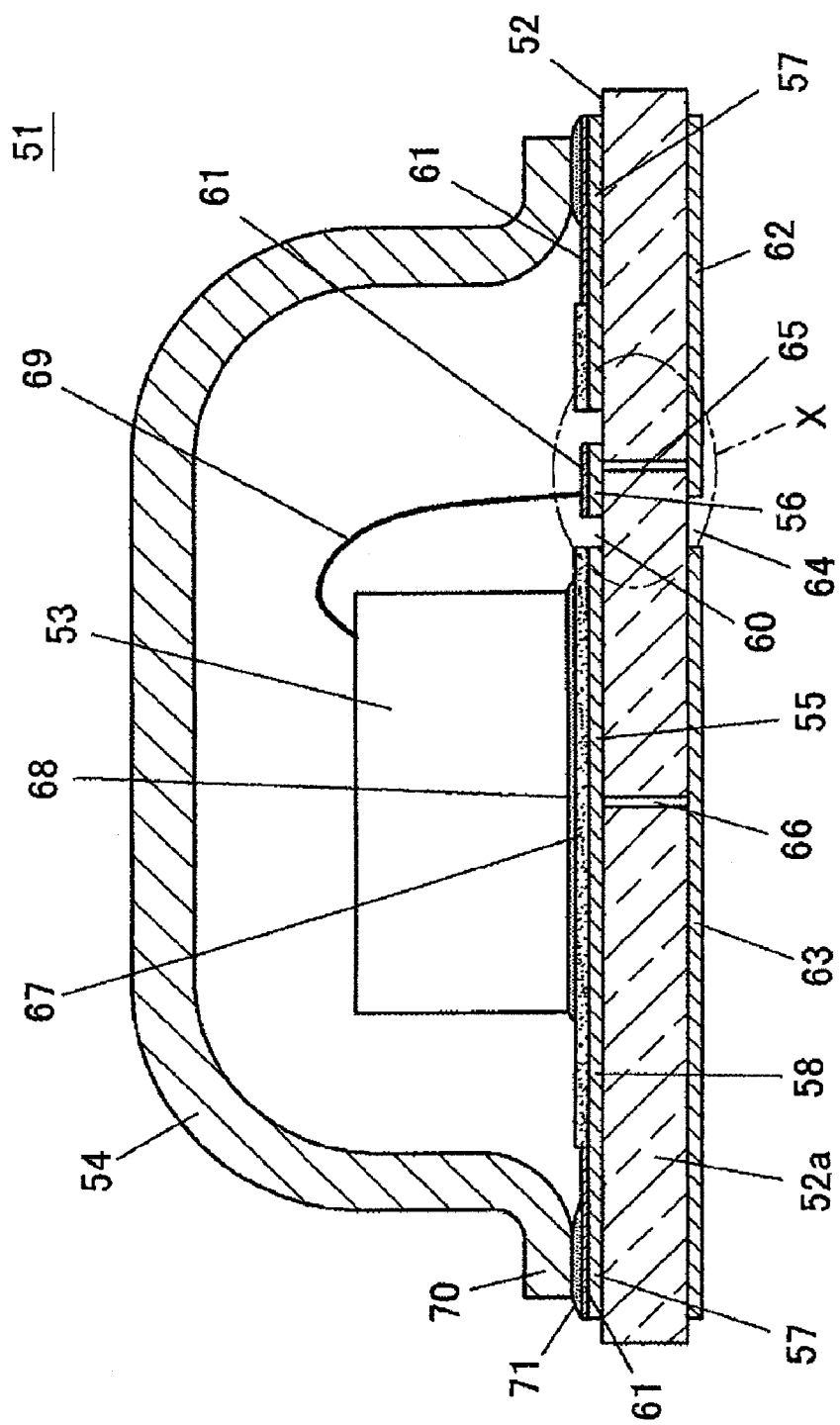
FIG. 2 is a sectional view illustrating a structure of an electronic component according to a first embodiment of the invention.
Figure 3:
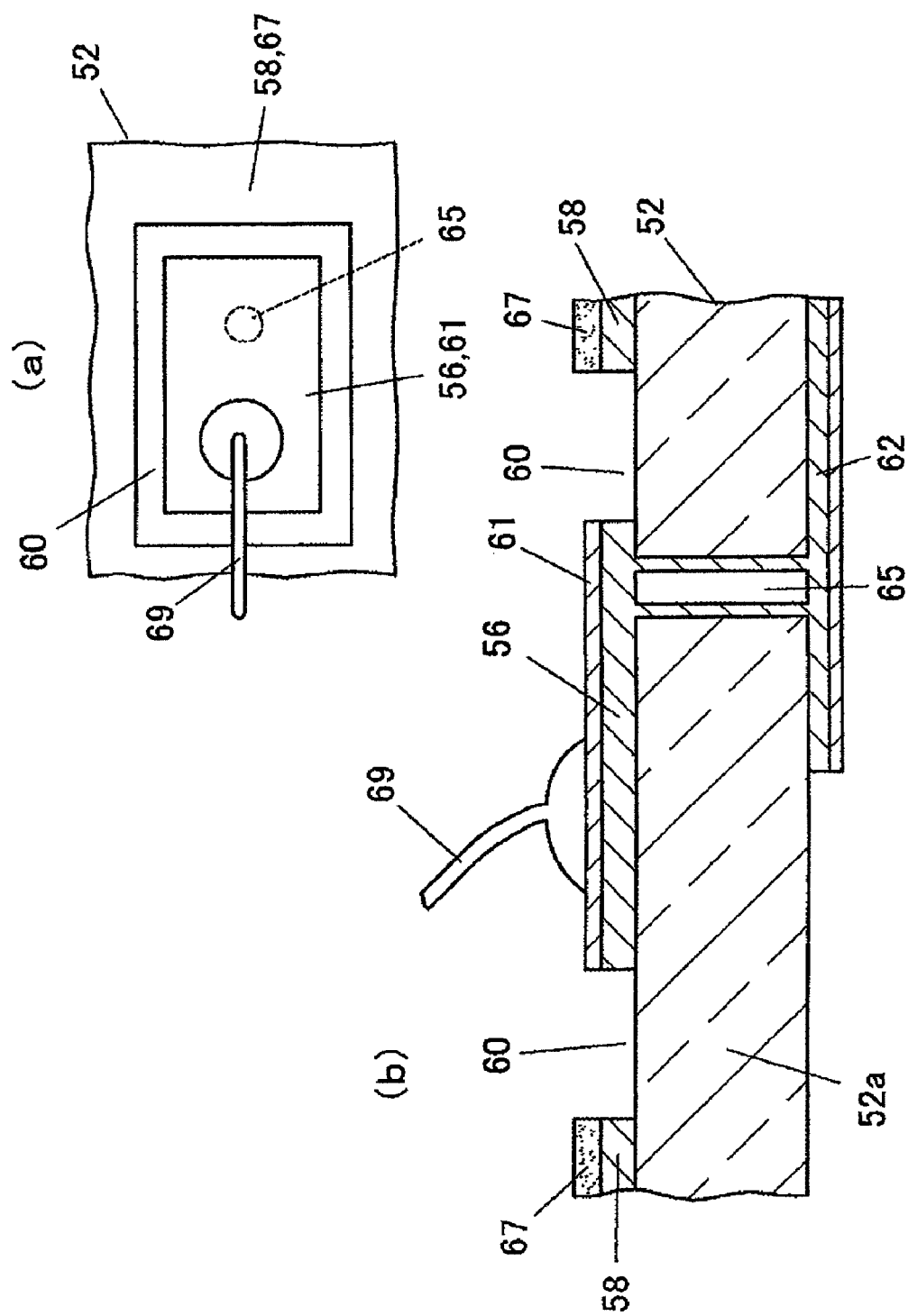
FIG. 3(a) is a plan view of an X portion of FIG. 2.
FIG. 3(b) is an enlarged sectional view of the X portion of FIG. 2.
Figure 4:
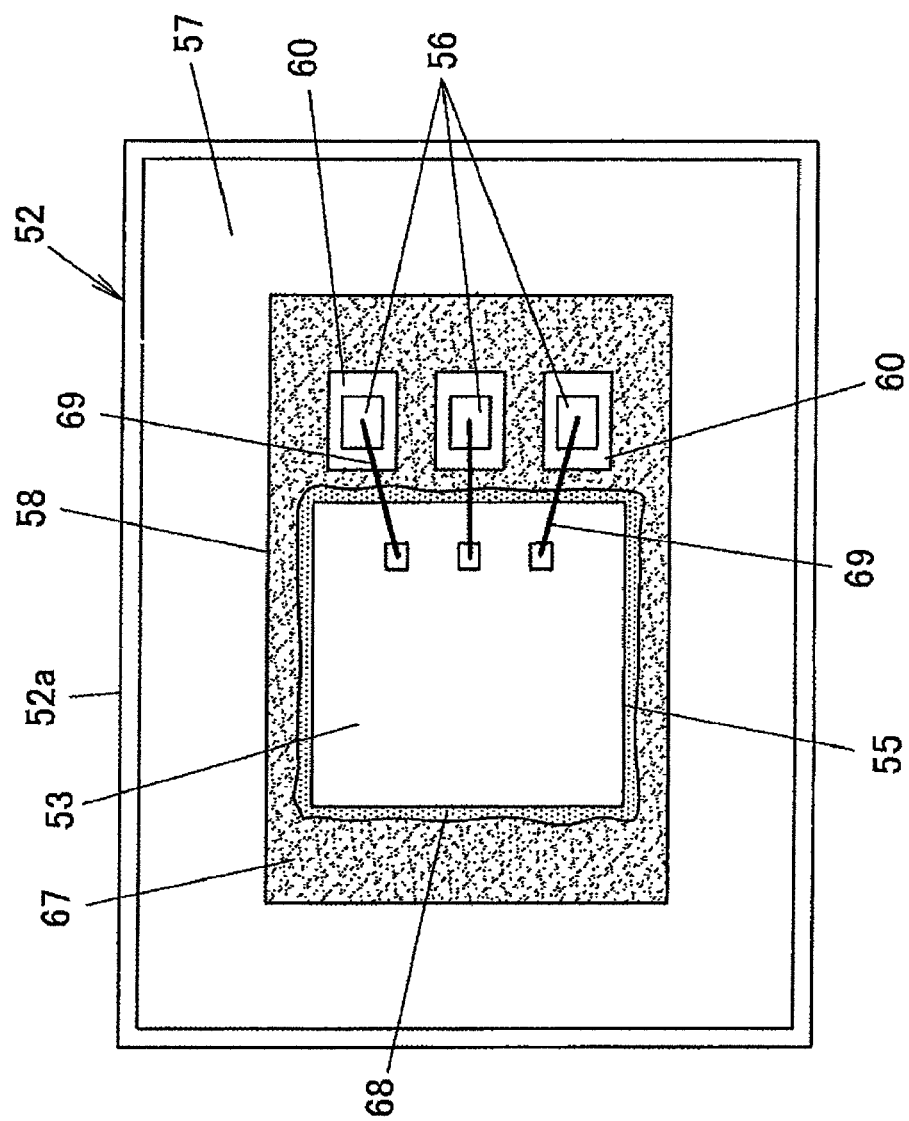
FIG. 4 is a plan view of a state in which a conductive cap of the electronic component is removed.

FIG. 2 is a sectional view illustrating a structure of an electronic component according to a first embodiment of the invention. FIG. 3(a) is a plan view of an X portion of FIG. 2, and FIG. 3(b) is an enlarged sectional view of the X portion of FIG. 2. FIG. 4 is a plan view of a state in which a conductive cap of the electronic component is removed. In an electronic component 51, a semiconductor element 53 is mounted on an upper surface of a substrate 52, and the semiconductor element 53 is accommodated in a package (Faraday cage) including the substrate 52 and a conductive cap 54.

The substrate 52 is formed by a printed substrate, and conductor patterns in which a metallic thin film made of Cu or the like is patterned are provided in an upper surface and a lower surface of an insulating substrate core material 52a. As illustrated in FIG. 4, a die bonding portion 55, a wire bonding terminal 56, a grounding electrode 57, and a surface-side ground pattern 58 are formed in the upper surface of the substrate 52 by the conductor patterns.

The wire bonding terminal 56 is a terminal that is used to feed electric power to semiconductor element 53 through a bonding wire 69 or to perform signal input/output. In the first embodiment, plural wire bonding terminals 56 are provided. A surrounding area of the wire bonding terminal 56 is separated from a surface-side ground pattern 58 by a groove portion 60 (air gap). The upper-surface-side groove portion 60 means a region that is located at a level lower than that of the upper surface of the conductor pattern while at least part of the conductor pattern is removed. Particularly, in the first embodiment, the upper-surface-side groove portion 60 is a region where the substrate core material 52a is exposed to the bottom surface while the conductor patterns are separated from each other. The groove portion 60 is formed by etching a metallic thin film, and the groove portion 60 has a width of about 0.10 mm and a groove depth of 0.02 to 0.03 mm. The wire bonding terminal 56 is disposed near the die bonding portion 55, and a surface of the wire bonding terminal 56 is coated with an Au plating 61.

The die bonding portion 55, the grounding electrode 57, and the surface-side ground pattern 58 are continuously formed and joined to one another. The grounding electrode 57 is a region to which the conductive cap 54 is joined. The grounding electrode 57 is formed in an outer peripheral portion of the substrate 52. The die bonding portion 55, the wire bonding terminal 56, and the surface-side ground pattern 58 are surrounded by the grounding electrode 57. Further, the surface of the grounding electrode 57 is coated with the Au plating 61.

The die bonding portion 55 is a region on which the semiconductor element 53 is mounted. The surface-side ground pattern 58 is a region except the die bonding portion 55, the grounding electrode 57, and the wire bonding terminal 56 in the conductor pattern of the upper surface. The die bonding portion 55 is defined in a region surrounded by the surface-side ground pattern 58, and surfaces of the die bonding portion 55 and surface-side ground pattern 58 are coated with a solder resist 67. After the solder resist 67 is applied to the surface of the substrate 52 with an even thickness by screen print of the solder resist in a melted state, the solder resist 67 is cured by heating. Alternatively, a silk screen may be used instead of the solder resist 67.

Plural lead electrodes 62 and a rear-surface-side ground pattern 63 are provided in the lower surface of the substrate 52 by the conductor pattern. The whole of the region where the lead electrode 62 does not exist is substantially coated with the rear-surface-side ground pattern 63. The lead electrode 62 and the rear-surface-side ground pattern 63 are separated by a groove portion 64. The lead electrode 62 and the rear-surface-side ground pattern 63 are patterns used to solder and mount the electronic component 51 on the substrate (for example, mother substrate for mobile telephone). The surfaces of the lead electrode 62 and the rear-surface-side ground pattern 63 are subjected to Au plating.

Through-holes 65 and 66 are made so as to penetrate from the surface of the substrate core material 52a to the rear surface, and each wire bonding terminal 56 is electrically connected to the lead electrode 62 through the through-hole 65.

The die bonding pad 55, the surface-side ground pattern 58, and the grounding electrode 57, which are integrally and continuously formed, are connected to the rear-surface-side ground pattern 63 through the through-hole 66.

The semiconductor element 53 is an element such as various sensing sensor chip (such as acoustic sensor, acceleration sensor, and pressure sensor), an LSI, and an ASIC. The lower surface of the semiconductor element 53 is rigidly bonded onto the die bonding portion 55 by the die bonding resin 68. Bonding resin such as silicone having flexibility is used as the die bonding resin 68. After the die bonding resin 68 applied to a transfer pin (stamper) is transferred onto the die bonding pad 55, the semiconductor element 53 is placed on the die bonding resin 68, the semiconductor element 53 is pressed with an even force, and the die bonding resin 68 is cured by heating to fix the semiconductor element 53. While the die bonding resin 68 functions to fix the semiconductor element 53, the flexibility of the die bonding resin 68 blocks an excess force from the external environment.

Ends of the bonding wires 69 formed by Au wires are welded to the terminal of the semiconductor element 53 and the wire bonding terminal 56, and the semiconductor element 53 and the wire bonding terminal 56 are connected by the bonding wire 69. Therefore, each terminal of the semiconductor element 53 electrically leads to the lead electrode 62 in the lower surface.

Plural semiconductor elements or other electric/electronic components may be mounted on the upper surface of the substrate 52. The conductor patterns may freely be designed according to the mode of the mounted semiconductor element or electric/electronic component.

The cap-shape conductive cap 54 is made of a metallic material having small specific resistance, and a space is formed in the lower surface of the conductive cap 54 in order to accommodate the semiconductor element 53 and the like. A flange 70 extended substantially horizontally is formed in a whole periphery in a lower end portion of the conductive cap 54.

The conductive cap 54 is placed on the substrate 52 such that the semiconductor element 53 and the like are covered therewith, the lower surface of the flange 70 is rigidly joined to the grounding electrode 57 by a conductive joining member 71, and the flange 70 is electrically connected to the grounding electrode 57 due to the conductivity of the conductive joining member 71. Therefore, a potential at the conductive cap 54 becomes equal to a potential (ground potential) at the rear-surface-side ground pattern 63 in the lower surface of the substrate 52. A material such as conductive epoxy resin (for example, epoxy resin containing silver filler) and solder is used as the conductive joining member 71.

When the mounted semiconductor element 53 is the acoustic sensor or the like, a hole (not illustrated) may be made in the conductive cap 54 in order to pass the acoustic vibration therethrough. The package including the conductive cap 54 and the substrate 52 may have a sealing structure according to the kind of the accommodated semiconductor element 53. For example, when dust or light is blocked from the outside, it is only necessary to cover the semiconductor element 53 and the like with the package, and it is not always necessary to establish the airtightness. On the other hand, when a humidity resistance or a chemical resistance is required, desirably the package has the airtightness.

In the electronic component 51, the Faraday cage is formed by the substrate 52. The substrate 52 includes the conductive cap 54 that is connected to the ground and the rear-surface-side ground pattern 63 and surface-side ground patterns 58, which are connected to the ground. Therefore, the semiconductor element 53 can be blocked from the external high-frequency noise to reduce the influence of the external noise on the semiconductor element 53.

The whole surface and whole rear surface of the substrate 52 are substantially coated with the conductive pattern, so that warpage of the substrate 52 caused by a temperature change can be prevented.

The reason the solder resist 67 is applied in the region that is not coated to the Au plating 61 in the conductor pattern of the upper surface of the substrate 52 is to protect, by an inexpensive material, the region where the electric joining of the conductor pattern is not required. The die bonding resin 68 such as silicone have higher bonding strength to the solder resist rather than the Au plating, so that the bonding strength of the semiconductor element 53 by the die bonding resin 68 can be enhanced by coating the die bonding portion 55 with the solder resist 67.

Further, a wire bonding defect at the wire bonding terminal 56 can be reduced in the electronic component 51. That the die bonding resin 68 flowing out from the die bonding portion 55 forms the coating film in the wire bonding terminal 56 to generate the wire bonding defect is already described in the background art. The reason the wire bonding defect can be reduced in the first embodiment will be described below.

In the first embodiment, as described above, the groove portion 60 having the small width 60 is provided so as to surround the wire bonding terminal 56. Therefore, even if the die bonding resin 68 flows out from the die bonding portion 55 to the wire bonding terminal 56 during the die bonding, the die bonding resin 68 is sucked in the groove portion 60 by a capillary phenomenon when the die bonding resin 68 reaches the groove portion 60. The die bonding resin 68 sucked in the groove portion 60 expands along the groove portion 60, so that the coating film can be prevented from being formed in the wire bonding terminal 56 beyond the groove portion 60. In the first embodiment, the groove has the width of about 0.1 mm. Because the die bonding resin 68 is more easily sucked by the capillary phenomenon with decreasing width of the groove, the groove width of the groove portion 60 may be decreased in consideration of the insulating property and the like.

Because the wire bonding terminal 56 is soiled by the die bonding resin 68 to prevent the generation of the coating film, the bonding is not prevented by the coating film in bonding the bonding wire 69 to the wire bonding terminal 56, and the wire bonding defect can be reduced. The necessity to increase the distance between the die bonding portion 55 and the wire bonding terminal 56 is eliminated, so that a line length of the bonding wire 69 can be shortened to suppress the cost increase.

The through-hole 65 that connects the wire bonding terminal 56 and the lead electrode 62 is made in the position distant from the region where the bonding wire 69 is joined. This is because the breakage of the through-hole 65 caused by an ultrasonic vibration can be prevented during the wire bonding.

Second Embodiment

Figure 5:
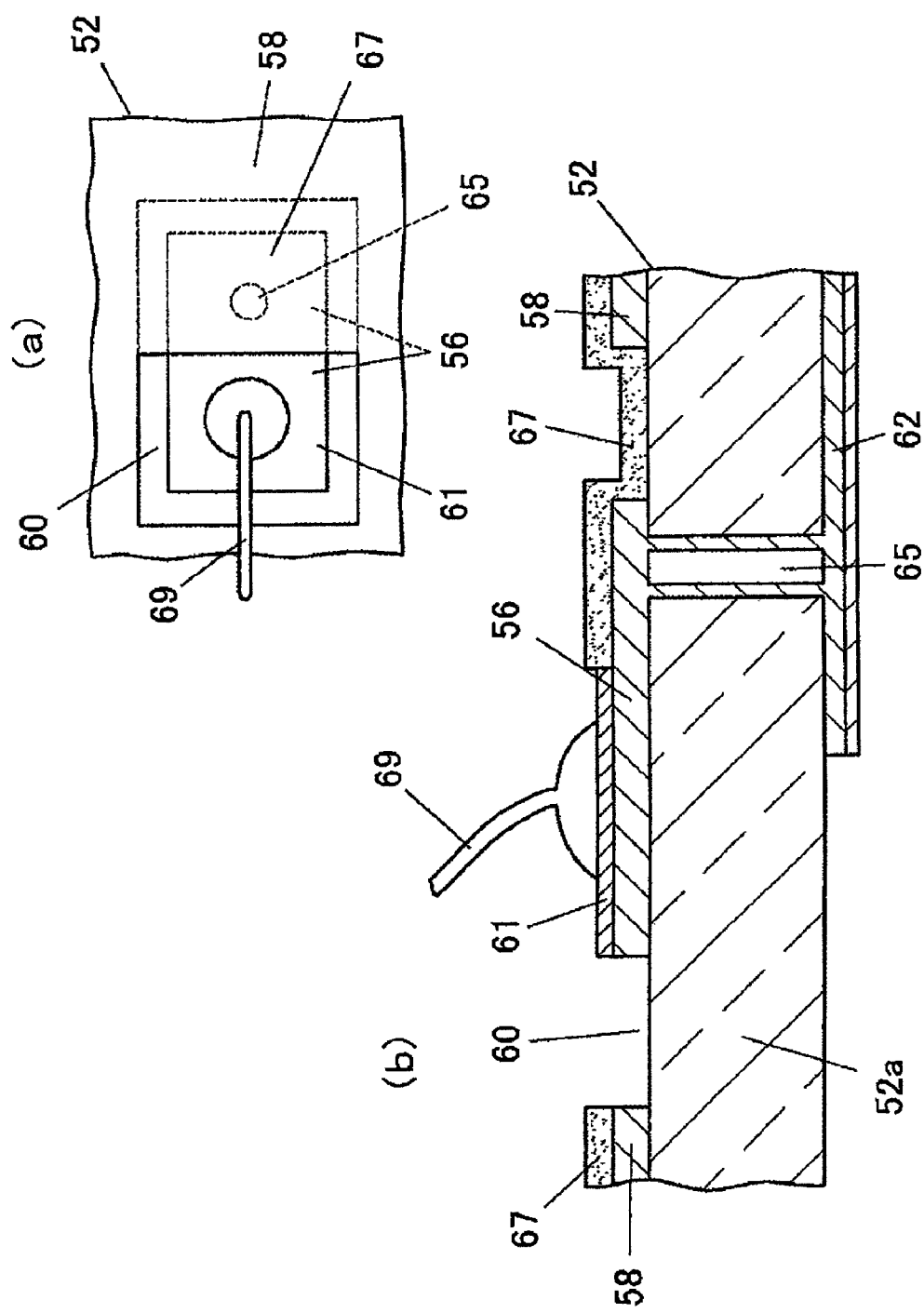
FIG. 5(a) is a plan view illustrating part of an electronic component according to a second embodiment of the invention.
FIG. 5(b) is an enlarged sectional view of the part of the electronic component.

FIG. 5(a) is a plan view illustrating part of an electronic component according to a second embodiment of the invention, and FIG. 5(b) is an enlarged sectional view of the part of the electronic component. In the second embodiment, after the groove portion 60 is formed over the whole periphery so as to surround the wire bonding terminal 56, part of the wire bonding terminal 56 is coated with the solder resist 67 while part of the groove portion 60 is filled with the solder resist 67 on the side farther away from the die bonding portion 55. The region that is exposed from the solder resist 67 in the wire bonding terminal 56, that is, the region on the side closer to the die bonding portion 55 is coated with the Au plating 61, and the region coated with the Au plating 61 constitutes the joining region of the bonding wire 69.

According to the second embodiment, the region that is not used for the wire bonding in the wire bonding terminal 56 is coated with the solder resist 67, so that the area of the Au plating region of the wire bonding terminal 56 can be reduced to decrease the cost of the substrate 52. On the other hand, in the direction in which the die bonding resin 68 flows, because the groove portion 60 is not coated with the solder resist 67, the die bonding resin 68 can be sucked, and the die bonding resin 68 can prevent the generation of the coating film in the wire bonding terminal 56.

Third Embodiment

Figure 6:
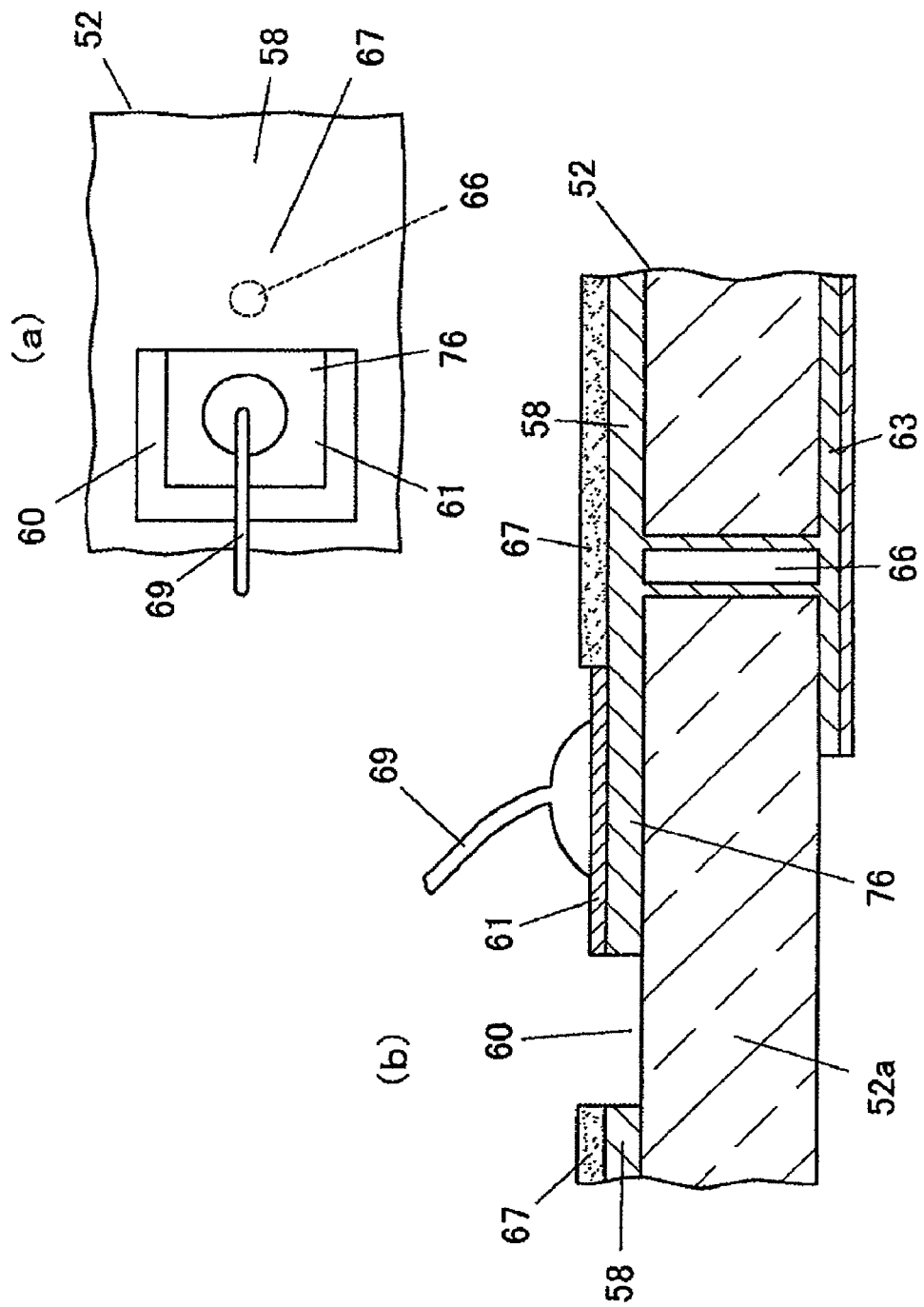
FIG. 6(a) is a plan view illustrating part of an electronic component according to a third embodiment of the invention.
FIG. 6(b) is an enlarged sectional view of the part of the electronic component.

FIG. 6(*a*) is a plan view illustrating part of an electronic component according to a third embodiment of the invention, and FIG. 6(*b*) is an enlarged sectional view of the part of the electronic component. In the third embodiment, a ground wire bonding terminal 76 is provided. The ground wire bonding terminal 76 is connected to the rear-surface-side ground pattern 63 in the lower surface by the through-hole 66. In the surroundings of the wire bonding terminal 76, the groove portion 60 is formed along a side (direction in which the die bonding resin 68 flows) closer to the die bonding portion 55 and both sides, and a side on the side farther away from the die bonding portion 55 of the wire bonding terminal 76 is connected to the surface-side ground pattern 58 or grounding electrode 57.

The surface (region exposed from the solder resist 67) of the wire bonding terminal 76 is subjected to the Au plating 61. The ground terminal of the semiconductor element 53 and the wire bonding terminal 76 are connected by the bonding wire 69.

In the third embodiment, although the groove portion 60 is not circularly closed, the flowing die bonding portion 55 is sucked in the groove portion 60 on the side closer to the die bonding portion 55. The portion in which the groove portion 60 does not exist is far away from the die bonding portion 55, and the die bonding resin 68 hardly runs round to reach the portion in which the groove portion 60 does not exist. Therefore, there is little influence on the effect that prevents the die bonding resin 68 from forming the coating film in the wire bonding terminal 76.

Fourth Embodiment

Figure 7:
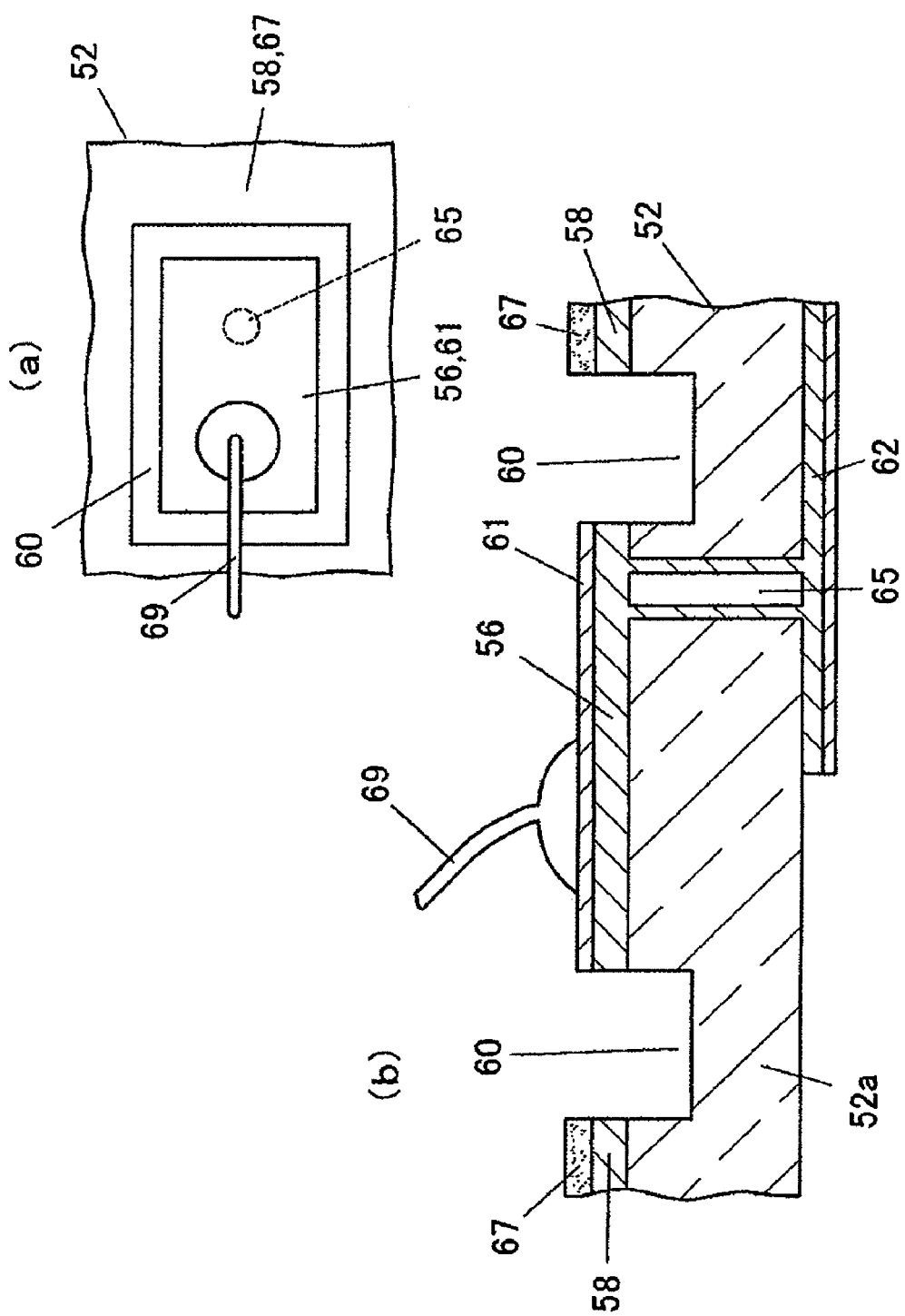
FIG. 7(a) is a plan view illustrating part of an electronic component according to a fourth embodiment of the invention.
FIG. 7(b) is an enlarged sectional view of the part of the electronic component.

FIG. 7(*a*) is a plan view illustrating part of an electronic component according to a fourth embodiment of the invention, and FIG. 7(*b*) is an enlarged sectional view of the part of the electronic component. In the fourth embodiment, the conductor pattern is removed to form the groove portion 60, and the substrate core material 52*a* beneath the conductor pattern is removed to deepen the groove portion 60. In the structure of the fourth embodiment, the amount of resin remaining in the groove portion 60 can be increased by increasing the depth of the groove portion 60. Because the amount of resin remaining in the groove portion 60 can be increased by increasing the depth of the groove portion 60, the risk of lowering the force for sucking the die bonding resin 68 by the capillary phenomenon is not generated unlike the case in which the groove width of the groove portion 60 is enlarged to increase the amount of remaining resin.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An electronic component comprising:
a printed substrate comprising a die bonding portion;
a semiconductor element rigidly bonded to the die bonding portion of the printed substrate by a die bonding resin, and
a wire bonding terminal formed by a conductor pattern on the printed substrate that is connected to the semiconductor element by a bonding wire, the wire bonding terminal comprising a die bonding portion side disposed adjacent to the die bonding portion and an opposite side disposed opposite to the die bonding portion side, wherein a solder resist layer is disposed on at least a portion of the opposite side,
wherein a groove portion located at a level lower than the conductor pattern of the printed substrate is formed in a region located on at least the die bonding portion side in a region surrounding the wire bonding terminal,
wherein the groove portion is open and is configured to receive excess die bonding resin.

2. The electronic component according to claim 1, wherein the groove portion is formed over a whole periphery of the region surrounding the wire bonding terminal.

3. The electronic component according to claim 1, wherein the groove portion is formed by removing the conductor pattern of the printed substrate.

4. The electronic component according to claim 3, wherein the groove portion is formed by further removing a substrate core material of the printed substrate.

5. The electronic component according to claim 1, wherein a surface of the wire bonding terminal is subjected to Au plating.

* * * * *